United States Patent [19]
Behbahani et al.

[11] Patent Number: 5,606,272
[45] Date of Patent: Feb. 25, 1997

[54] COMPARATOR WITH SMOOTH START-UP FOR HIGH FREQUENCIES

[75] Inventors: Farbod Behbahani, Inglewood; Ali Fotowat-Ahmady, San Rafael; Nasrollah S. Navid, Saratoga, all of Calif.

[73] Assignee: Philips Electronics North America Corporation, New York, N.Y.

[21] Appl. No.: 540,517

[22] Filed: Oct. 10, 1995

[51] Int. Cl.$^6$ ............................................. H03K 5/22
[52] U.S. Cl. ........................ 327/65; 327/563; 327/333; 330/254
[58] Field of Search ...................... 327/65, 77, 63, 327/66–71, 333, 164, 291, 198, 142, 334, 560, 563; 330/254, 281, 141, 252

[56] References Cited

U.S. PATENT DOCUMENTS

| | | | |
|---|---|---|---|
| 4,847,567 | 7/1989 | Fenk | 330/254 |
| 5,313,207 | 5/1994 | Kouno et al. | 330/252 |
| 5,341,120 | 8/1994 | Nakajima | 327/63 |
| 5,475,323 | 12/1995 | Harris et al. | 327/65 |

*Primary Examiner*—Toan Tran
*Attorney, Agent, or Firm*—Steven R. Biren

[57] ABSTRACT

A comparator has a simple high frequency signal path from input to output formed by two differentially connected transistors with an output transistor connected to each. A current control circuit maintains a constant total current flowing through the differentially connected transistors. The ratio of currents flowing through the differentially connected transistors is initially set by a control circuit, so that the output of the comparator is predictable when powered up. The control circuit then gradually releases control, so that there is a smooth transfer to control by a reference signal input to the comparator.

15 Claims, 5 Drawing Sheets

COMPARATOR WITH SMOOTH START-UP FOR HIGH FREQUENCIES

BACKGROUND OF THE INVENTION

1. Field of the Invention

The present invention is directed to providing a comparator circuit for use in high frequency applications and, more particularly, to a comparator with a smooth start-up for use in a phase-locked loop or level-locked loop, for example in a time-division multiple access (TDMA) telephony system.

2. Description of the Related Art

A phase-locked loop is commonly used in radio communications at a wide range of frequencies, for both analog and digital signals. In some conventional phase-locked loops for carrier recovery, a comparator is used. It is desirable for phase-locked loops to lock quickly, particularly when the entire transmitter or receiver in a TDMA system is powered up and down many times every second for power savings. Since a comparator is a non-linear high gain circuit, if it is powered up without proper controls, it can throw the loop into states from which it cannot recover, or at least cause a delay in circuit start-up.

SUMMARY OF THE INVENTION

It is an object of the present invention to provide a comparator suitable for high frequency phase-locked loop applications.

It is also an object of the present invention to provide a comparator having a predictable output when power is initially applied.

It is another object of the present invention to provide a comparator gradually changing from a predetermined output to an output based on received signals, shortly after power is initially applied.

It is an additional object of the present invention to provide a duty ratio adjustment circuit for high frequency oscillating signals, which quickly produces an output signal after gradually changing from a predetermined duty ratio.

The above objects can be attained by a comparator formed of a comparison circuit coupled to receive at least two input signals and generating at least one output signal based on the at least two input signals; and a control circuit, coupled to the comparison circuit and to receive at least one start-up signal indicating start-up of the comparator, controlling the comparison circuit to generate the output signal with a predetermined value upon receipt of the start-up signal and gradually releasing control of the comparison circuit.

Preferably, also included is a constant current circuit coupling the control circuit to the comparison circuit and maintaining a constant total current through the comparison circuit when the control circuit has completely released control of the comparison circuit. To handle high frequency signals efficiently, the comparison circuit preferably consists of only a pair of differentially connected transistors having collectors respectively and directly connected to the bases of a pair of output transistors. The emitters of the output transistors are preferably directly connected to output signal lines.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 1:
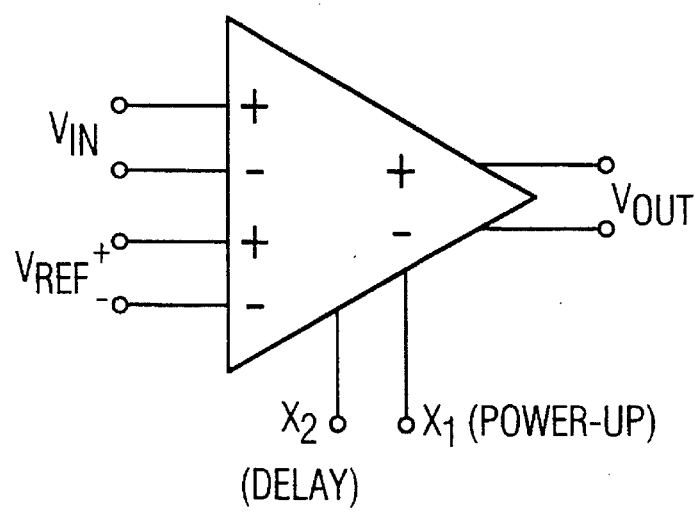
FIG. 1 is the block diagram symbol of a comparator.
Figure 2A:
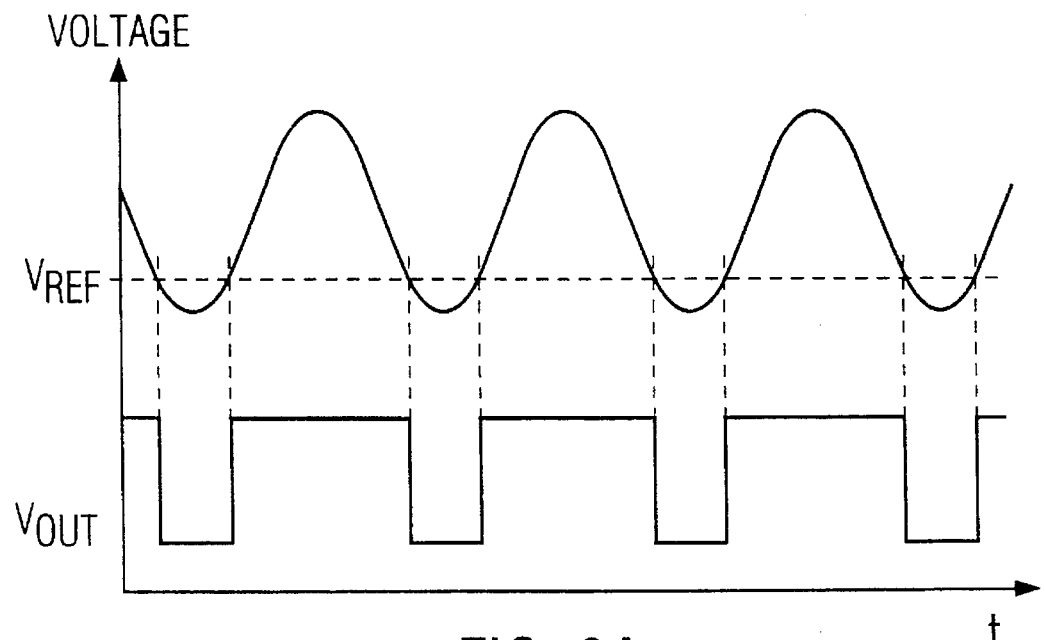
FIG. 2A and 2B are graphs of square waves with different duty ratios produced from sinusoidal waves using different reference voltages.
Figure 2B:
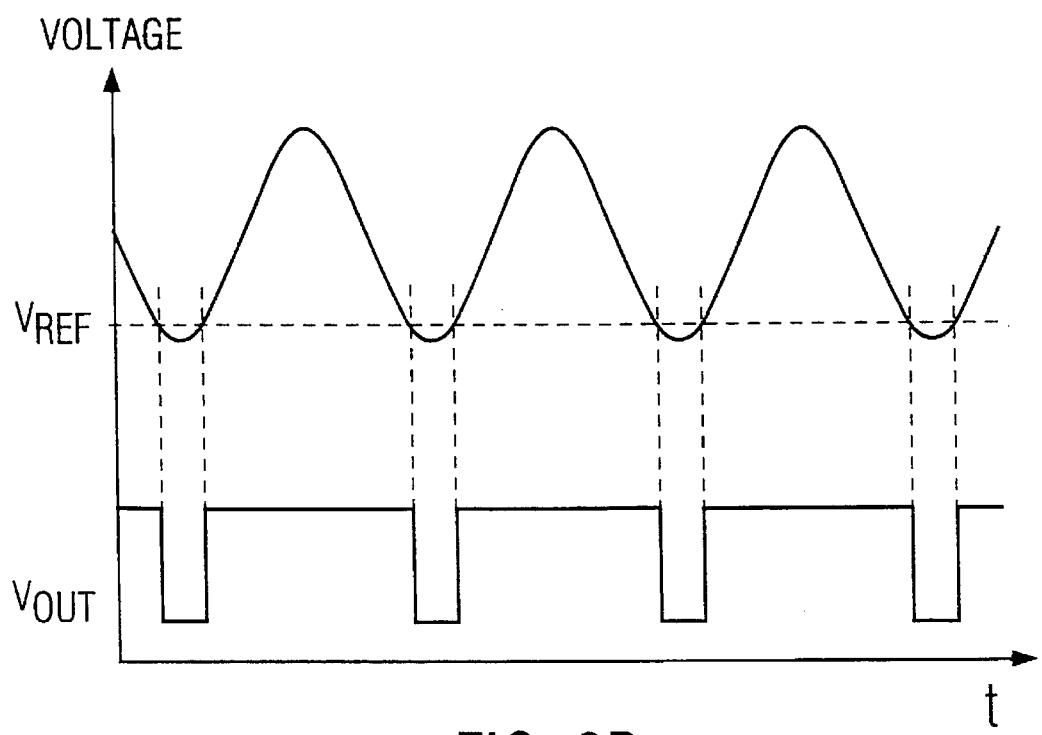

Illustrated in FIG. 1 is a block diagram symbol of a comparator that can be used for the present invention. As illustrated in FIG. 1, all inputs and outputs are differential, so that all signal connections to the comparator are shown. The symbol illustrated in FIG. 1 may be used for comparators operating on both analog and digital signals. The present invention is particularly useful as a level shifter, or duty ratio adjustment circuit where an oscillating signal is supplied as Vin and a direct current (DC) voltage is supplied as Vref. The resulting output signal Vout is typically a square wave. For example, the signals Vin and Vref illustrated in FIGS. 2A and 2B produce the output signal Vout.

Figure 3:
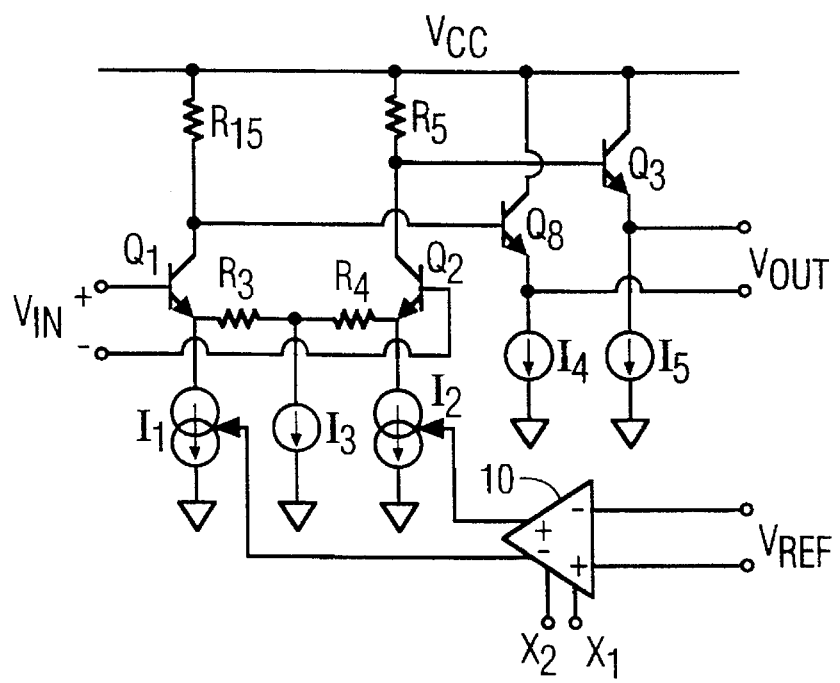
FIG. 3 is a simplified circuit diagram of an embodiment of a comparator according to the present invention.

A simplified circuit diagram of a comparator according to the present invention is illustrated in FIG. 3. Two features of the comparator which make it suitable for applications at frequencies as high as 1 GHz are illustrated in FIG. 3. First, the path of the high frequency signals from input to output is very simple and direct. The input signal Vin is supplied to the bases of the differentially connected transistors Q1 and Q2. The collectors of transistors Q1 and Q2 are connected directly to the bases of transistors Q8 and Q3, respectively. Constant current sources I4, I5 are coupled to the emitters of each of these transistors. The output signal is produced at the emitters of the output transistors Q3 and Q8. The alternating current (AC) gain at the amplifier is fixed by the ratio of the resistances of the resistors coupled to the collectors and emitters of transistors Q1 and Q2, i.e., the resistance ratio of R15/R3 which is the same as R5/R4.

The variable current sources I1 and I2 respectively connected to the emitters of transistors Q1 and Q2 define the direct current (DC) offset level. A current control circuit represented by comparator symbol 10 receives the DC reference voltage Vref to control the current sources I1 and I2. Inside the current control circuit 10, first zero volts is applied instead of the DC reference voltage Vref. This ensures that currents produced by variable current sources I1 and I2 are equal at the beginning of the power-up cycle. Then Vref is gradually applied by applying αVref, where α is linearly increased from zero to one. This guarantees a smooth and predictable transition of Vout from fully balanced to the final state controlled by Vref.

Figure 4:
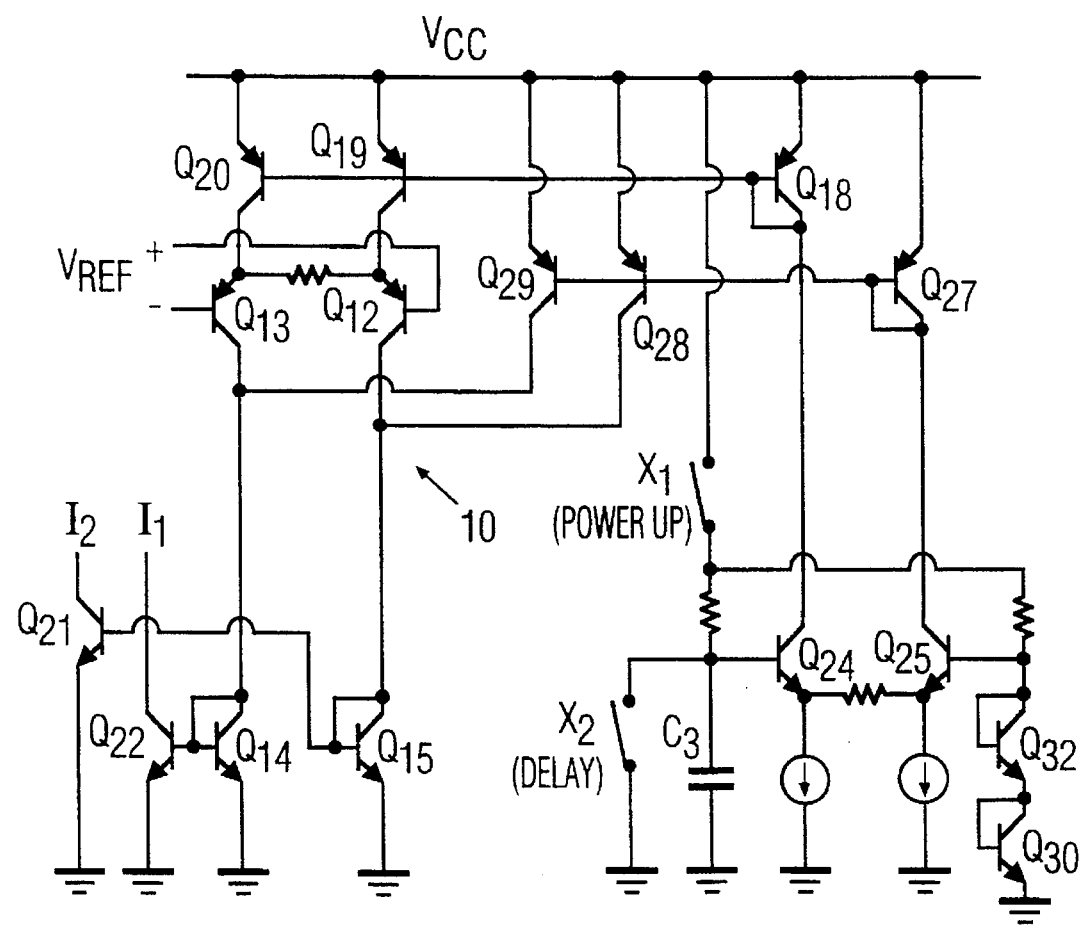
FIG. 4 is a simplified circuit diagram of a control circuit for a comparator according to the present invention.

Details of the current control circuit 10 and a control circuit for smooth start-up are illustrated in FIG. 4. As illustrated in the upper left-hand corner of FIG. 4, a pair of differentially coupled transistors Q12, Q13 have bases which receive the DC reference voltage Vref.

The variable current sources I1 and I2 (FIG. 3) in the current control circuit are provided by current control transistors Q21, Q22 in FIG. 4. The bases of current control transistors Q21, Q22 are connected to the bases of diode-connected transistors Q15, Q14, respectively, to mirror the current flowing through transistors Q15, Q14. This is one of the design features of the present invention which enable the signal path of the high frequency signals to be as simple and direct as possible, while the signal processing for Vref is done in a more complex circuit without affecting the high frequency path.

As illustrated in FIG. 4, a control circuit is preferably included in a comparator according to the present invention to provide a smooth start-up. The control circuit includes a shunt circuit formed by transistors Q19, Q20, Q28 and Q29. As illustrated in FIG. 4, transistors Q19 and Q20 are supply transistors that supply current to transistors Q12, Q13 from the power supply line VCC. Shunt transistors Q28, Q29 provide a shunt path around the differentially connected transistors Q12, Q13 in the current control circuit. When transistors Q19 and Q20 are turned off and transistors Q28 and Q29 are turned on, identical currents flow through diode-connected transistors Q14, Q15 and thus through current control transistors Q21, Q22.

The shunt circuit is controlled by the remainder of the control circuit illustrated on the right side of FIG. 4. Diode-connected transistor Q18 is connected to the bases of the supply transistors Q19, Q20, while diode-connected transistor Q27 is connected to the bases of the shunt transistors Q28, Q29. Current flow through the diode-connected transistors Q18, Q27 is controlled by a third pair of differentially connected transistors Q24, Q25. These control transistors have bases connected to receive external control signals represented by switches X1 (power up) and X2 (delay). The base of the first control transistor Q24 is also connected to a capacitor C3.

In the preferred embodiment, the power-up signal is generated first and is represented in the simplified embodiment illustrated in FIG. 4 by closing switch X1. A delay signal is generated later, opening switch X2. As a result, the second control transistor Q25 is turned on first and the first control transistor Q24 is kept turned off until the delay signal is received and switch X2 is opened. Prior to receipt of the delay signal, current control transistors Q28 and Q29 will be on and supply transistors Q19, Q20 will be off, thereby shunting or bypassing the second differentially connected transistors Q12, Q13 in the current control circuit. Therefore, the currents I1 and I2 will be equal and a predetermined value will be used in generating the output of the comparator.

When the delay signal is received, switch X2 is opened permitting the capacitor C3 to charge up gradually and turn on transistor Q24. The diode-connected transistors Q30, Q32, coupled to the base of the second control transistor Q25, maintain a constant voltage. As the voltage at the base of the first control transistor Q24 builds up, the supply transistors Q19, Q20 gradually turn on and as the voltage at the base of the first control transistor Q24 exceeds the fixed voltage at the base of transistor Q25, shunt transistors Q28, Q29 gradually turn off. Thus, a short period of time after the delay signal is received, the currents I1, I2 are controlled by the value of Vref supplied to the bases of the second pair of differentially connected transistors Q12, Q13 in the current control circuit.

The difference between a comparator according to the present invention and a conventional comparator can be expressed mathematically. The output of a conventional comparator can be represented by equations (1) and (2), where the Sgn function extracts the algebraic sign of VinP–VinN.

$$Vout^+ = +A \cdot Sgn(VinP-Vin) \quad (1)$$

$$Vout^- = -A \cdot Sgn(VinP-Vin) \quad (2)$$

In a comparator according to the present invention, the output can be represented by equations (3)–(7).

$$Vout^+ = +A \cdot Sgn(VinP-Vin) + \alpha Vref \quad (3)$$

$$Vout^- = -A \cdot Sgn(VinP-Vin) - \alpha Vref \quad (4)$$

where $$\alpha = 0 \text{ for } t_{power-up} < t < t_{delay} \quad (5)$$

$$\alpha = at \text{ for } t_{delay} < t < \frac{1}{a} \quad (6)$$

$$\alpha = 1 \text{ for } \frac{1}{a} < t \quad (7)$$

Figure 5:
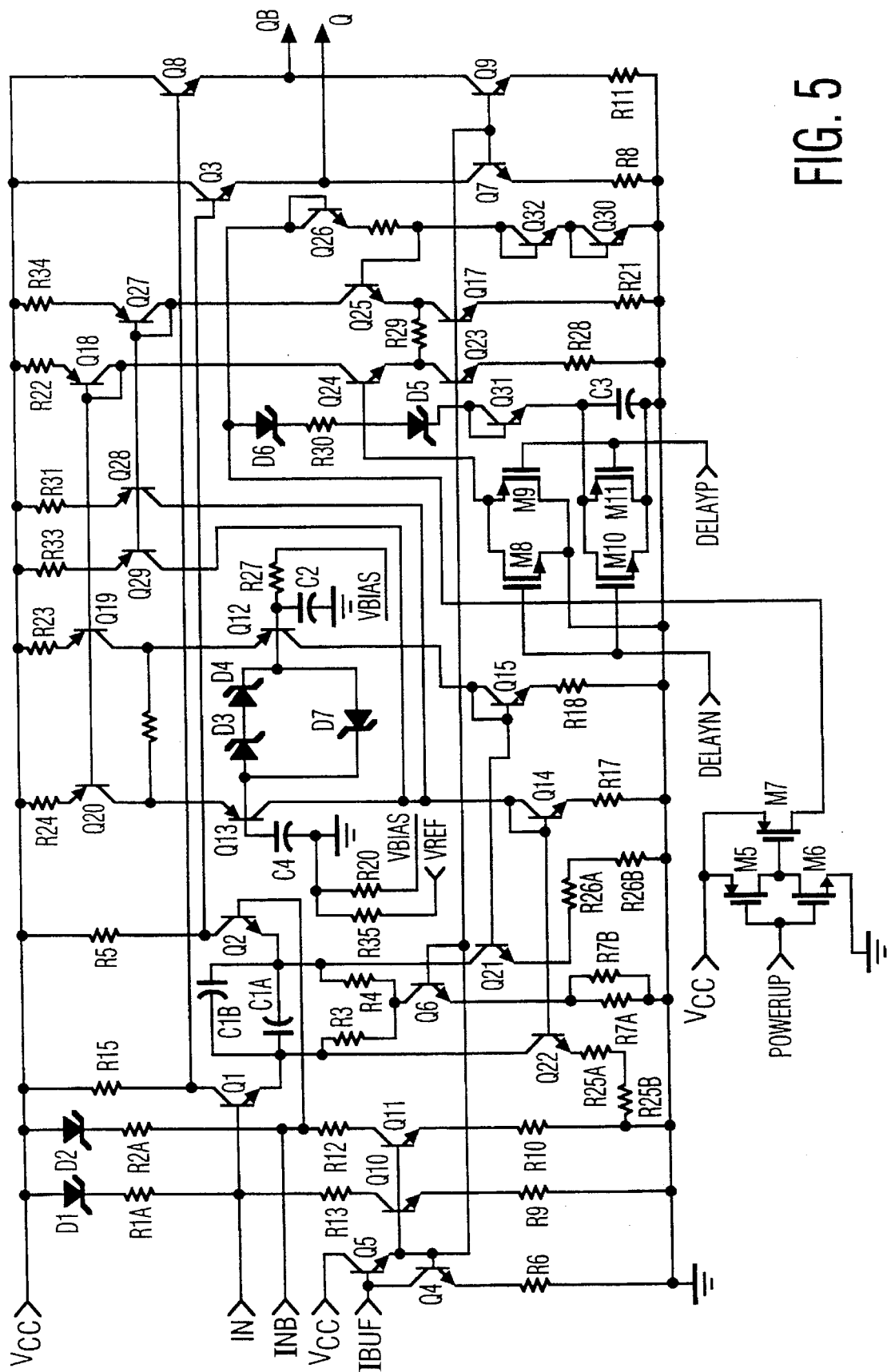
FIG. 5 is a schematic circuit diagram of a comparator according to the present invention.

A detailed circuit diagram of a comparator according to the present invention is provided in FIG. 5. The same reference numerals are used to identify the circuit components illustrated in FIGS. 3 and 4. Illustrated in FIG. 5 are biasing circuits, some of which will be described later, and switching circuits replacing the simplified switches X1, X2 illustrated in FIG. 4. The POWER UP signal controls switching transistors M5–M7 to supply power to the control circuit. The delay signal is formed by differential signals DELAYN and DELAYP. When DELAYN is high, the switching circuit formed by transistors M8–M11 ground the base of first control transistor Q24 and the capacitor C3. When DELAYN goes low and DELAYP goes high, the connection to ground is broken and current flows through the Schottky diode D10, diode-connected transistor Q31 and capacitor C3, gradually turning on the first control transistor Q24, as described above.

Two signals are received for biasing purposes. At the input, a signal with a current IBUF maintains a constant DC bias for the inputs IN, INB by turning on transistors Q4, Q5, Q10 and Q11, so that current flows through Schottky diodes D1, D2, resistors R1A, R2A, R9, R10, R12 and R13. In addition to turning on transistors Q10, Q11, transistors Q17, Q23 in the control circuit and transistors Q7, Q9 in the output circuit are also turned on.

A bias signal VBIAS is also supplied via resistors R20, R27 to the bases of the second pair of differentially connected transistors Q12, Q13 in the current control circuit. This voltage provides an operating bias on top of which the reference voltage Vref is applied. In the embodiment illustrated in FIG. 5, the reference voltage Vref is not illustrated as a differential voltage, because it is supplied relative to ground.

Figure 6:
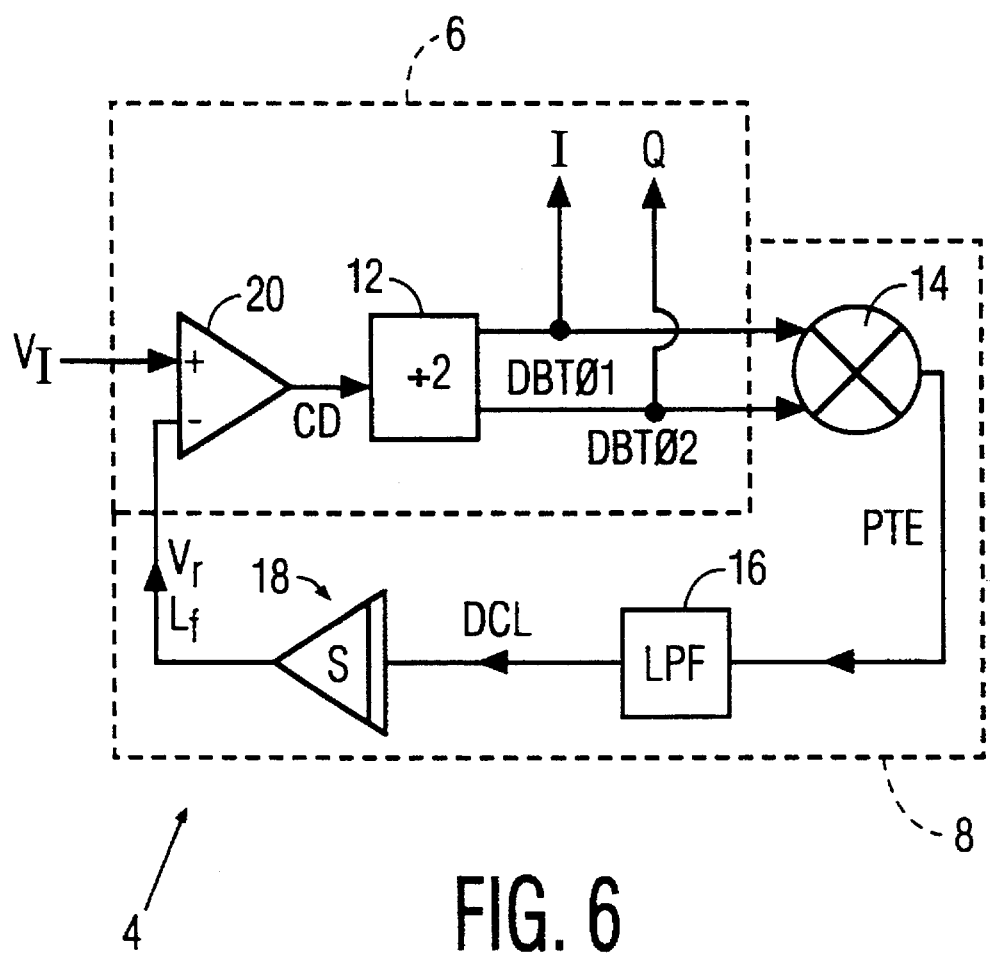
FIG. 6 is a block diagram of a level-locked loop using a comparator according to the present invention.

As described above, a comparator according to the present invention can be used as a level shifter, or duty ratio adjustment circuit generating a square wave at low frequencies or a quasi-square wave at high frequencies, having a duty ratio which depends upon the reference signal Vref. A comparator circuit according to the present invention is particularly well suited for high-frequency applications, such as the level-locked loop circuit disclosed in U.S. patent application Ser. No. 08/366,550, filed Dec. 30, 1994, commonly assigned to U.S. Philips, and incorporated herein by reference. For example, in the level-locked loop circuit illustrated in FIG. 6, the comparator 20 may be a comparator constructed according to the present invention.

The many features and advantages of the invention are apparent from the detailed specification and, thus, it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

REFERENCE NUMBER LIST

C1A–C4 capacitors
D1–D7 Diodes
I1–I5 Current sources
IN, INB Input signal lines
M1–M11 Transistors (FETs used for switching)
OUT, OUTB Output signal lines
R1–R35 Resistors
Q1–Q32 Transistors
VCC Power supply voltage
Vin Input voltage
Vout Output voltage
Vref Reference voltage

What is claimed is:

1. A comparator, comprising:
   a comparison circuit coupled to receive at least one input signal and generating at least one output signal based on the at least one input signal; and
   a control circuit, coupled to said comparison circuit and to receive at least one start-up signal indicating start-up of said comparator, controlling said comparison circuit to generate the output signal with a predetermined value upon receipt of the start-up signal and gradually releasing control of said comparison circuit.

2. A comparator as recited in claim 1, further comprising a current control circuit coupling said control circuit to said comparison circuit and maintaining a constant total current through said comparison circuit when said control circuit has completely released control of said comparison circuit.

3. A comparator as recited in claim 2,
   further comprising at least one output signal line outputting the at least one output signal, and
   wherein said comparison circuit comprises:
      a pair of differentially connected transistors having bases coupled to receive first and second input signals included in the at least one input signal, having emitters coupled to said current control circuit and having collectors; and
      a pair of output transistors having bases respectively connected to the collectors of said pair of differentially connected transistors, at least one of said output transistors coupled to said at least one output signal line.

4. A comparator as recited in claim 3, wherein the bases of said output transistors are directly connected to the collectors of said pair of differentially connected transistors and the at least one of said output transistors is directly connected to said at least one output signal line.

5. A comparator as recited in claim 4,
   wherein said output transistors have emitters, and
   wherein said at least one output signal line includes two output signal lines respectively and directly connected to the emitters of said output transistors.

6. A comparator as recited in claim 2,
   wherein the at least one input signal includes first and second input signals and at least one reference signal,
   wherein said comparison circuit comprises a first pair of differentially connected transistors having bases coupled to receive the first and second input signals and having emitters coupled to said current control circuit, and
   wherein said current control circuit comprises:
      a second pair of differentially connected transistors, coupled to said control circuit and having respective collectors, bases and emitters, at least one of the bases coupled to receive the at least one reference signal; and
      a pair of current control transistors having collectors respectively connected to the emitters of said first pair of differentially connected transistors in said comparison circuit and having bases respectively coupled to the emitters of said second pair of differentially connected transistors in said current control circuit.

7. A comparator as recited in claim 6, wherein said control circuit comprises a shunt circuit, coupled to said second pair of differentially connected transistors in said current control circuit, providing a shunt path around said second pair of differentially connected transistors upon receipt of the start-up signal.

8. A comparator as recited in claim 7,
   further comprising first and second power supply lines coupled to said first and second pairs of differentially connected transistors, said current control transistors, and said shunt circuit,
   wherein said shunt circuit comprises:
      a pair of supply transistors respectively coupled between said first power supply line and the collectors of said second pair of differentially connected transistors in said current control circuit and having bases;
      a pair of shunt transistors, coupled between said first power supply line and the emitters of said second pair of differentially connected transistors in said current control circuit and having bases, and
   wherein said control circuit further comprises:
      first and second control transistors forming a third differentially connected pair of transistors, said first control transistor coupled between the bases of said supply transistors and said second power supply line and said second control transistor coupled between the bases of said shunt transistors and said second power supply line; and
      a delay circuit coupled to said first and second power supply lines and said third differentially connected pair of transistors and to receive the start-up signal, to turn said supply transistors off and said shunt transistors on upon receipt of the start-up signal and to gradually turn said shunt transistors off and said supply transistors on.

9. A comparator as recited in claim 1, wherein said control circuit comprises:
   a delay circuit coupled to receive the start-up signal and producing at least one control signal from receipt of the start-up signal until a delay period has passed; and
   a level control circuit, coupled to said comparison circuit and said delay circuit, to maintain the predetermined value of the output signal while the control signal is generated.

10. A comparator as recited in claim 9, wherein said delay circuit produces a first control signal upon receipt of the start-up signal and a second control signal after the delay period, and wherein said control circuit further comprises a pair of differentially connected transistors coupled to said level control circuit and having a first and second bases respectively coupled to receive the first and second control signals from said delay circuit.

11. A comparator as recited in claim 10, wherein said delay circuit comprises a capacitor, coupled to the second base of said differentially connected transistors, changing the second control signal gradually after receipt of the start-up signal.

12. A comparator as recited in claim 11, wherein said delay circuit is further coupled to receive a delay signal after receipt of the start-up signal, and wherein said capacitor begins changing the second control signal upon receipt of the delay signal.

13. A level shifter, comprising:

a first pair of differentially connected transistors having bases coupled to receive input signals having a frequency, and having respective collectors and emitters;

a second pair of differentially connected transistors, having bases coupled to receive reference signals and having respective collectors and emitters;

an output circuit coupled to at least one of the collectors of said first pair of differentially connected transistors and producing at least one output signal having a frequency corresponding to the frequency of the input signals and at least one level based on the reference signals;

a pair of current control transistors having collectors respectively coupled to the emitters of said first pair of differentially connected transistors and having bases respectively coupled to the emitters of said second pair of differentially connected transistors;

first and second power supply lines coupled to said first and second pairs of differentially connected transistors, said output circuit and said current control transistors;

a pair of supply transistors having bases, respectively coupled between said first power supply line and the collectors of said second pair of differentially connected transistors;

a pair of shunt transistors having bases, coupled between said first power supply line and the emitters of said second pair of differentially connected transistors;

first and second control transistors forming a third differentially connected pair of transistors, said first control transistor coupled between the bases of said supply transistors and said second power supply line and said second control transistor coupled between the bases of said shunt transistors and said second power supply line;

a control circuit, coupled to said power supply lines and said third differentially connected pair of transistors, to output a start-up signal to said first and second control transistors turning said supply transistors off and said shunt transistors on.

14. A level shifter as recited in claim 13, wherein said control circuit further outputs a delay signal after output of the start-up signal, and further comprising a capacitor coupled to at least one of said power supply lines, one of said first and second control transistors and to said control circuit to receive the delay signal and gradually turn said shunt transistors off and said supply transistors on when the delay signal is output.

15. A square wave generator, comprising:

a first pair of differentially connected transistors having bases coupled to receive oscillating signals having a frequency, and having respective collectors and emitters;

a second pair of differentially connected transistors, having bases coupled to receive reference signals and having respective collectors and emitters;

a pair of output transistors having bases respectively and directly connected to the collectors of said first pair of differentially connected transistors and outputting from said square wave generator at least one square wave signal having a frequency corresponding to the frequency of the oscillating signals and a duty ratio based on the reference signals;

a pair of current control transistors having collectors respectively coupled to the emitters of said first pair of differentially connected transistors and having bases respectively coupled to the emitters of said second pair of differentially connected transistors;

first and second power supply lines coupled to said first and second pairs of differentially connected transistors, said output transistors and said current control transistors;

a pair of supply transistors having bases, respectively coupled between said first power supply line and the collectors of said second pair of differentially connected transistors;

a pair of shunt transistors having bases, coupled between said first power supply line and the emitters of said second pair of differentially connected transistors;

first and second start-up transistors forming a third differentially connected pair of transistors, said first start-up transistor coupled between the bases of said supply transistors and said second power supply line and said second start-up transistor coupled between the bases of said shunt transistors and said second power supply line;

a control circuit, coupled to said power supply lines and said third differentially connected pair of transistors and to receive a start-up signal and a delay signal, outputting a first control signal to said first and second control transistors turning said supply transistors off and said shunt transistors on when the start-up signal is received, and outputting a second control signal when the delay signal is received; and a capacitor, coupled to said second power supply line, said first control transistor and to said control circuit to receive the second control signal, gradually turning said shunt transistors off and said supply transistors on when the second control signal is output.

* * * * *